United States Patent

Smith

[15] 3,646,467

[45] Feb. 29, 1972

[54] SOLID-STATE ELECTROMAGNETIC ENERGY AMPLIFIER SYSTEM

[72] Inventor: Burton H. Smith, Lexington, Mass.

[73] Assignee: Raytheon Company, Lexington, Mass.

[22] Filed: Nov. 2, 1970

[21] Appl. No.: 86,172

[52] U.S. Cl. ..............................330/53, 330/61 A, 333/80 T

[51] Int. Cl. ..............................H03f 3/60

[58] Field of Search ................330/61 A; 333/80 T; 307/322, 307/324

[56] References Cited

OTHER PUBLICATIONS

Electronics, May 30, 1966– p. 113 Tunnel Diodes for Bandwidth

*Primary Examiner*—Nathan Kaufman

*Attorney*—Harold A. Murphy, Joseph D. Pannone and Edgar O. Rost

[57] ABSTRACT

A high-power solid-state amplifier system is disclosed having plural semiconductor amplifying elements electrically oriented in parallel in a multistage array. The number of elements in each stage successively increases with all elements operating at substantially the same RF voltage level. The stages are interconnected by circulator transmission means. Two modes of operation are permissible, namely, as a reflection-type amplifier or phase lock oscillator. Suggested amplifying elements include negative resistance semiconductors of the bulk effect or avalanche-type.

5 Claims, 8 Drawing Figures

SOLID-STATE ELECTROMAGNETIC ENERGY AMPLIFIER SYSTEM

BACKGROUND OF THE INVENTION

1. Field of the Invention

The invention relates to solid-state high-frequency amplifier systems employing numerous semiconductor oscillators operatively associated in parallel in a multistage array.

2. Description of the Prior Art

The generation of coherent high-frequency energy in the microwave spectrum utilizing reverse biased semiconductor devices was first demonstrated by W. T. Read in 1958. Advances since that date have established negative resistance devices utilizing avalanche transit time technology as an important source of electromagnetic energy. The term "avalanche" has been utilize in the art to collectively define many solid-state sources including IMPATT diodes and LSA mode devices while "bulk effect" defines Gunn oscillator devices.

In many respects such solid-state sources are comparable to the klystron vacuum tube utilizing a velocity modulated electron beam coupled to resonant cavities to generate coherent energy over relatively narrow bandwidths. Electron transit time and bunching of the charge carriers through surrounding high Q resonant cavities in klystrons have produced stable oscillations at low power levels. In the evolution of the art relating to generation and amplification of electromagnetic energy from vacuum tube to solid-state technology and inhibiting factor has been peak and average power capabilities in either pulsed or continuous wave operation. Requirements for present day systems utilizing electromagnetic energy dictate the need for higher power levels. Solid-state energy sources, however, have heretofore produced only minimal levels of power expressed in terms of fractions of watts in the reverse-biased configuration coupled to a suitable high-frequency resonant circuit.

The devices under consideration are inherently nonlinear and the peak amplitude of oscillation arises within a period of a few RF cycles. High electric fields and avalanche currents, however, create thermal energy dissipation problems due to the high current densities with $I^2R$ loss which limit overall power generation capabilities. Experimenters in the field have reported generation of several hundred watts of power at fixed frequencies upwards of 10 gHz. with gallium arsenide avalanche transit time devices. It has also been noted in the art that numerous pulsed Gunn oscillators can be phase locked with an external CW RF source to produce stable signals with efficiencies as high as 60 percent. An article of interest may be found in the proceeding of the IEEE, Nov. 1966, Vol. No. 54, Issue No. 6, pages 1591–1592 by S. Mayo and J. Gelbwachs. Another article of interest relates to gallium arsenide IMPATT diodes for the generation of microwave energy may be found in an article in the Microwave Journal, July, 1969, pages 71–75. The generation of high-frequency electromagnetic energy by solid-state sources utilizing avalanche transit time technology will be substantially enhanced if new and novel systems are provided coupling many such sources in an array yielding high power gain factors.

SUMMARY OF THE INVENTION

In accordance with the teachings of the present invention, a solid-state amplifier system having relatively high gain to achieve high power performance is provided by an interconnected plural high-frequency resonant circuit means each loaded with a successively increasing number of amplifying elements. Semiconductor means such as the bulk effect or avalanche oscillators are mounted in parallel within each resonant circuit. In one embodiment a plurality of stages are provided interconnected by multiport circulator transmission means together with suitable impedance matching means coupled thereto. The larger number of the semiconducting elements will result in the generation of an amplified signal having a relatively high gain factor. Each of the amplifying elements operate at substantially the same RF voltages. One port of the circulator transmission means is coupled to energy absorbing means to reduce power reflections at the utilization load and between stages. The system provides for two modes of operation, specifically, as a reflection-type amplifier or phase locked oscillator. The total number of semiconductor elements that may be operated in parallel within each resonant circuit is empirically determined and is limited solely by size, cost and thermal energy dissipation considerations.

BRIEF DESCRIPTION OF THE DRAWINGS

The invention, as well as the details for the provision of an illustrative embodiment, will be readily understood after consideration of the following detailed description and reference to the accompanying drawings, wherein.

DESCRIPTION OF THE PREFERRED EMBODIMENT

Figure 1:
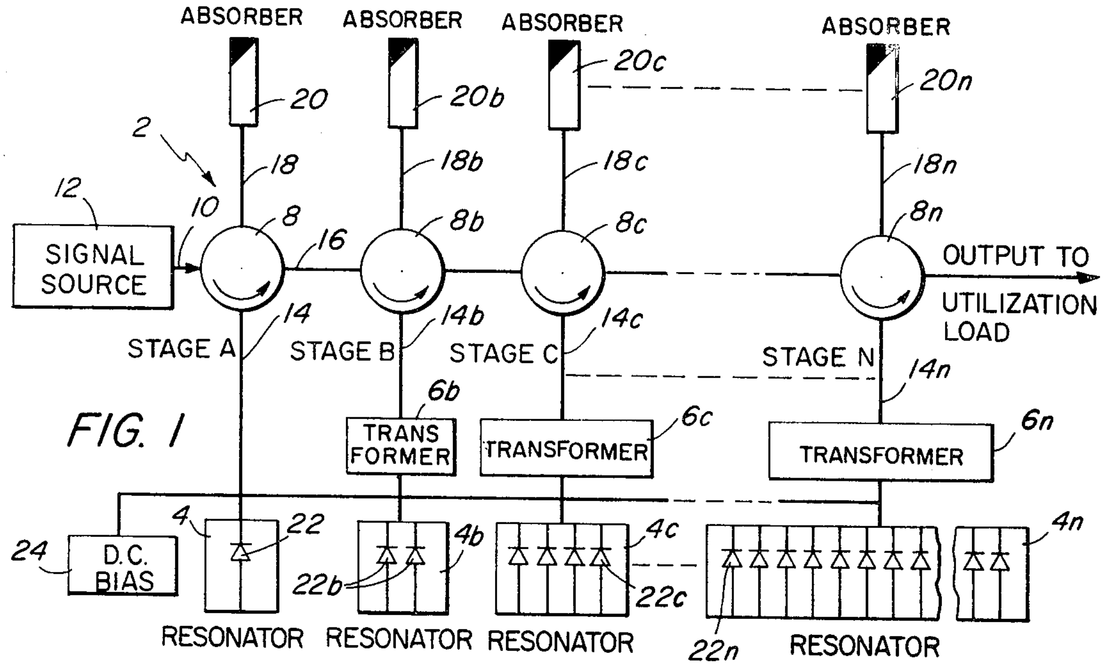
FIG. 1 is a diagrammatic representation of an embodiment of the invention.

Referring to FIG. 1 an illustrative multistage system 2 embodying the invention is shown. A plurality of resonant circuit means 4 are coupled by suitable impedance transformers 6 to multiport ferrimagnetic transmission means, such as a circulator 8. In stage A port 10 is coupled to a suitable low power level high-frequency energy source 12 providing either pulsed or continuous signals to be amplified. Port 14 couples the incoming signal to the resonant circuit means. In the modes of operation to be hereinafter described, the original signal is either amplified by reflection amplifier techniques or a phase locked signal is injected into the transmission line interconnected by the circulator means. Port 16 provides for the coupling of the first stage output to the succeeding stage designated B. The remaining port 18 of circulator 8 is coupled to a high-frequency energy-absorbing means 20. The absorber presents means between the input and output signals for preventing oscillations within the system 2 by reason of power reflections at the utilization load or between the stages.

To provide relatively high gain in the amplification of the high-frequency energy each succeeding resonant circuit means 4 include a successively increasing number of paralleled semiconductor amplifying elements 22. Each of the amplifying elements are provided by suitable DC biasing means with a reverse bias for the desired negative resistance characteristics. Bulk effect or avalanche-type diodes of the Gunn or IMPATT type are utilized for the oscillators utilized as the amplifying elements. In stage A a single element 22 is indicated and the number of such elements successively increases. To assist in the understanding of the invention similar components in each stage have been designated by small letters corresponding to the stage designations. A total number of 81 solid-state amplifying elements will be incorporated in the final stage of an exemplary embodiment for operation as a three-stage reflection amplifier. The power output from such an amplifier with an input drive of 0.125 watts is estimated to be 91.125 watts with a resultant gain of 28.62 db.

The ultimate limit in the total power output involves the mechanical consideration of the design of coaxial transmission lines employed in coupling the respective amplifier stages. For example, in stage A of the illustrative reflection-type amplifier, an impedance of 100 ohms would be presented in a line having a single solid-state amplifying element in the resonant circuit 4. In the final stage of the illustrative amplifier with 81 elements, each providing an individual gain of 9.54 db. the impedance will be 1.23 ohms. The final amplified output signal is couple by means of port **16*n*** to a suitable utilization load.

Figures 2, 3:
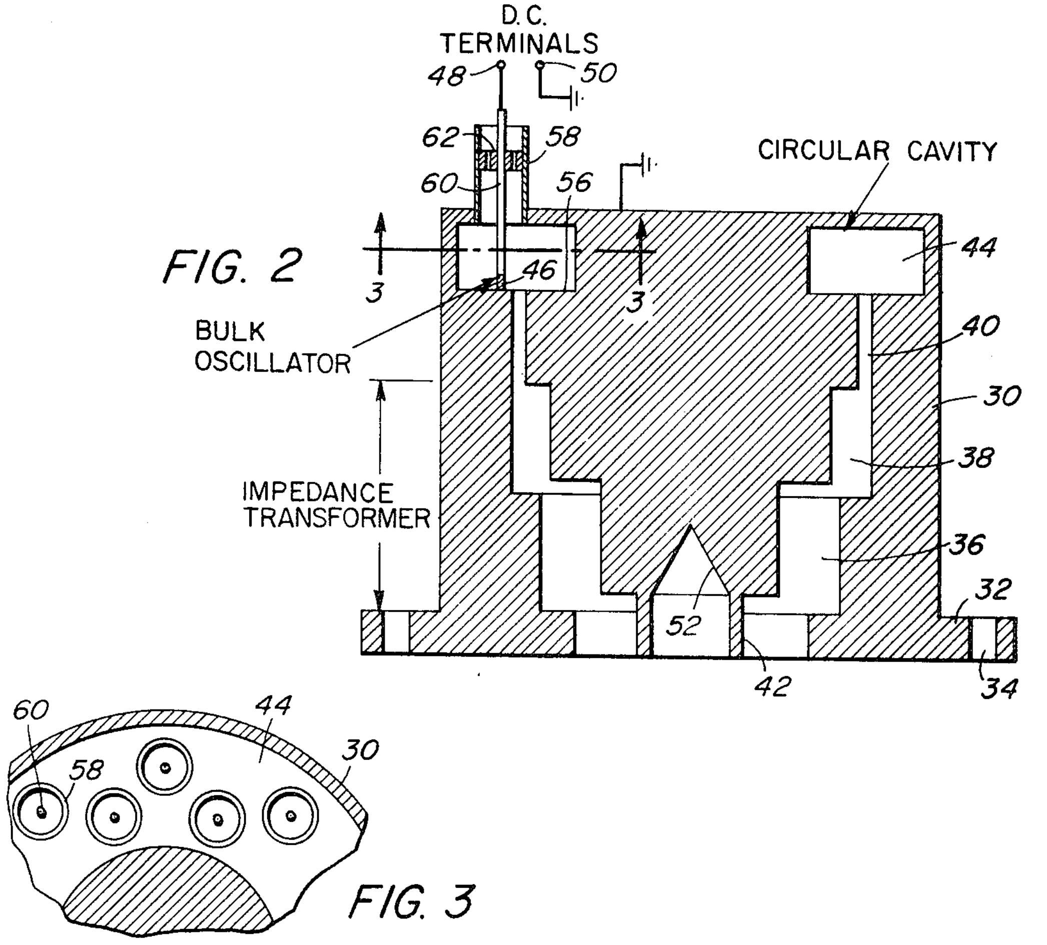
FIG. 2 is a cross-sectional view of the final stage of an illustrative system embodying the invention.
FIG. 3 is a cross-sectional view taken along the line 3—3 in FIG. 2.

In FIGS. 2 and 3, the final stage of a structure embodying the present invention is shown. A housing of a conductive material 30 is provided with a mounting flange 32 and suitable coupling holes 34. Impedance matching is provided by a series of transformers 36, 38 and 40 in the propagation path. Energy is introduced by means of a standard coaxial wave transmission line coupled to center conductor stub 42 followed by the impedance matching transformer means. The path is connected to circular resonant cavity 44 housing a plurality of bulk oscillator elements 46 disposed therein in an electrically parallel array. Terminals 48 and 50 provide for DC reverse biasing of oscillator elements. The high-power-amplified signal is coupled to the utilization means through the same coaxial transmission line connected to stub 42 which is shorted by an inner wall 52. The plurality of bulk oscillators are mounted within the resonant cavity on wall 56 with a shorted coaxial stub 58 on the opposing wall. Center conductor 60 together with stub 58 provides for the completion of the DC connections to the amplifying elements. A coaxial stub 58 is provided for each of the amplifying elements within circular cavity 44. An RF choke 62 prevents escape of the high-power RF energy generated within the cavity 44.

Figure 4:
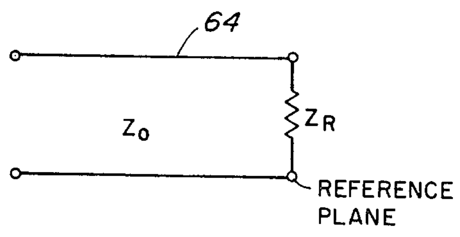
FIG. 4 is an equivalent circuit diagram of a terminated transmission line.

An analysis of the operation of the device as a reflection amplifier discloses in FIG. 4 an equivalent circuit for a terminated transmission line. If it is assumed that an electromagnetic wave traveling down transmission line 64 has a characteristic impedance $Z_O$, the reflection of voltage associated with such a wave at the reference plane 3—3 in FIG. 2 or impedance $Z_R$ is given by the equation:

$$\frac{\overleftarrow{V}}{\underrightarrow{V}}=\Gamma=\frac{Z_O-Z_R}{Z_O+Z_R} \qquad (1)$$

where $\overrightarrow{V}$ is the amplitude of the incident voltage wave and $\overleftarrow{V}$ is the amplitude of the reflected voltage wave. If one assumes a conductance $G_O$ equal to $1/Z_O$ and $G_R$ equal to $1/Z_R$ the relation in the preceding equation will be as follows:

$$\Gamma=\frac{G_O-G_R}{G_O+G_R}=-\frac{\frac{G_R}{G_O}}{+\frac{G_R}{G_O}} \qquad (2)$$

Figure 5:
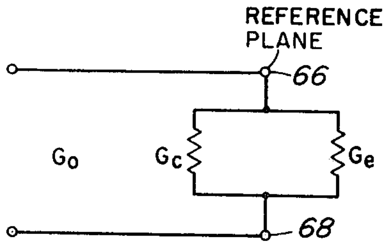
FIG. 5 is an equivalent circuit diagram of a resonant oscillator embodiment.

The equivalent circuit for the terminated transmission line has now been modified in FIG. 5 to include the conductance of the bulk oscillator 46 indicated by the symbol $G_e$ and the conductance of the resonant cavity 44 including stubs 58 as $G_c$. The resultant reflection coefficient equation is then:

$$\Gamma=\frac{1-\frac{G_R+G_c}{G_O}}{1+\frac{G_e+G_c}{G_O}} \qquad (3)$$

When the reflection coefficient is greater than unity the amplitude of the reflected wave will be greater than the incident wave and gain will occur. If the ratio $(G_c+G_e)/G_O$ is a negative number greater than unity, then the device will oscillate. The gain of any given stage in the amplifier system is calculated from the following equation:

$$\text{gain}=\frac{\text{Power Out}}{\text{Power In}}=\frac{\frac{1}{2}\overleftarrow{V}^2G_O}{\frac{1}{2}\underrightarrow{V}^2G_O}=\frac{\overleftarrow{V}^2}{\underrightarrow{V}^2}=\Gamma^2 \qquad (4)$$

If the conservation of energy is assumed at the reference plane 3—3, in FIG. 2, equation (4) may be written as the following:

$$\tfrac{1}{2}\overrightarrow{V}_12G_O-\tfrac{1}{2}V^2G_e=\tfrac{1}{2}V^2G_c+\tfrac{1}{2}\overleftarrow{V}^2 \qquad (5)$$

where $V$ is the voltage across terminals 66 and 68. It is also assumed that when the oscillator is delivering power $G_e$ is negative. Equation (5) is, therefore, rearranged as:

$$V=\frac{G_O}{G_c+G_e}=\sqrt{\overrightarrow{V}^2+\overleftarrow{V}^2}=\frac{G_O}{G_c+G_e}=\overrightarrow{V}\sqrt{1+\Gamma^2} \qquad (6)$$

and the circuit efficiency for a single stage is given by the relation in the following equation:

$$N_e=\frac{\frac{1}{2}V^2G_e-\frac{1}{2}V^2G_c}{\frac{1}{2}V^2G_e}=1-\frac{G_c}{G_e} \qquad (7)$$

This efficiency is multiplied by the conversion efficiency of the amplifying oscillator elements 22 employed in each stage to get the total stage efficiency.

Figure 6:
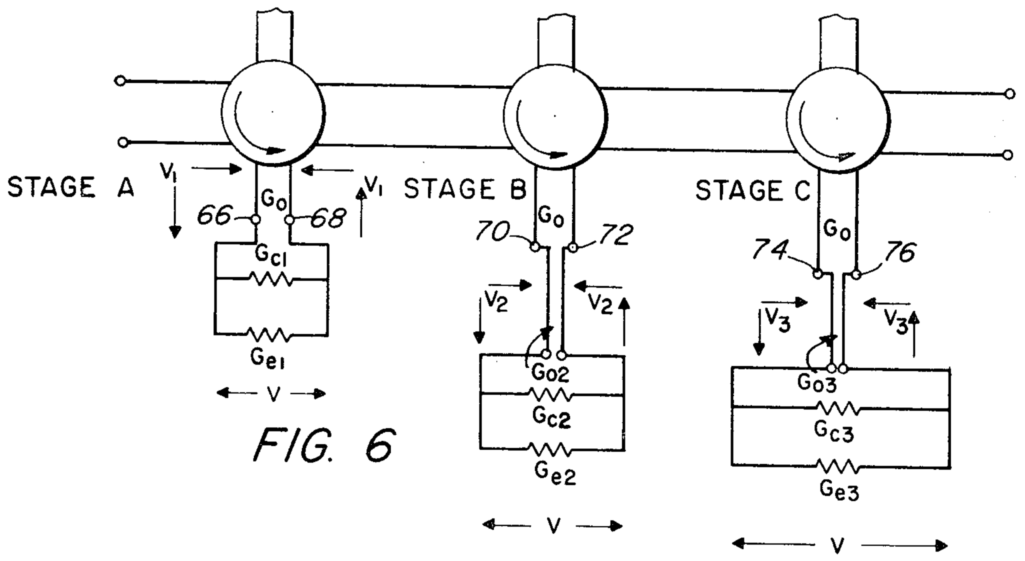
FIG. 6 is a schematic circuit diagram illustrative of a multistage reflection-type amplifier system embodiment of the invention.

In FIG. 6 a three-stage system is illustrated arranged similar to stages A, B and C shown in FIG. 1. It is assumed that the amplifier elements comprising the bulk oscillators used in all three stages have identical electrical parameters and are operated at substantially the same RF voltages. The appropriate impedance transformers are utilized at the terminals 70 and 72 in stage B and terminals 74 and 76 in stage C. With the transformer means the transmission line characteristic impedance is changed from $G_O$ to $G_{O2}$ and $G_{O3}$ without introducing significant reflection of RF power. The relation between the input voltage $\overrightarrow{V}_1$ and the output voltage $\overleftarrow{V}_1$ has been shown to be $\Gamma$ and that the power gain is $\Gamma^2$. In order to ensure that the RF voltage across the succeeding groups of oscillator elements equals the first group, it is required that:

$$\overrightarrow{V}_2=\overrightarrow{V}_1;\text{ and }\Gamma_2=\Gamma_1 \qquad (8)$$

The power flowing along the lines coupled to terminals 70 and 72 is represented by:

$$\tfrac{1}{2}\overleftarrow{V}_1^2G_O=\tfrac{1}{2}\Gamma^2\overrightarrow{V}_1^2G_O \qquad (9)$$

which is equal to:

$$\tfrac{1}{2}\overrightarrow{V}_2^2G_{O2} \qquad (10)$$

It will be noted that the relations are equal, therefore,:

$$\overrightarrow{V}_2G_{O2}=\Gamma^2\overrightarrow{V}_1^2G_O \qquad (11)$$

In view of the fact that the conditions require $\overrightarrow{V}_2$ equal to $\overrightarrow{V}_1$, then:

$$G_{2O}/G_O=\Gamma^2 \qquad (12)$$

The requirement that the reflection coefficients be equal will occur if:

$$G_{c2}=\Gamma^2G_{c1}$$
$$G_{e2}=\Gamma^2G_{e1} \qquad (13)$$

Next, third stage C is considered which requires that:

$$\overrightarrow{V}_3=\overrightarrow{V}_1\text{ and }\Gamma_3=\Gamma_1 \qquad (14)$$

If the energy relations are considered this means that:

$$\tfrac{1}{2}\overrightarrow{V}_3^2G_{O3}=\tfrac{1}{2}\overrightarrow{V}_1^2\cdot G_{O1}\cdot\Gamma^2\cdot\Gamma^2 \qquad (15)$$

making $\overrightarrow{V}_3$ equal to $\overrightarrow{V}_1$ and causes $G_{O3}=G_{O1}\Gamma^4$. In a similar manner the conductance of the oscillators $G_{e3}$ equals the fourth power of ($\Gamma$) multiplied by the first stage oscillator conductance and $G_{c3}=\Gamma^4G_{c1}$. In the illustrative example with the 81 elements and an input drive power of 0.125 watts, the overall resulting power output is approximately 91.125 watts. It is evident, therefore, that the multistage parallel amplifier system coupled by circulators has the advantage of high power gain.

A device and equivalent circuit described in the preceding illustration may also be employed with the parallel amplifying elements, in a phase locked arrangement with cascaded stages. This arrangement would also provide similar high power gain and bandwidths. Whereas in the previous device where all the powers are summed, in the phase locked operation only the final stage will provide for the total output power. The method of operation is defined in the well-known manner by the following equation:

$$(a\sin\theta)/(2Q_e)=(W_1-W_2)/(W_2) \qquad (16)$$

where $a=\sqrt{P_{in}/P_{out}}$ $P_{in}$ = locking power fed into oscillator $P_{out}$ = *oscillator power output*

$\theta$ = phase angle between RF voltage of the locking signal and RF voltage of the output signal $Q_e$ = oscillator external Q $W_1$ = frequency of the locking signal; and $W_2$ = natural frequency of the oscillator without a locking signal present.

Figure 7:
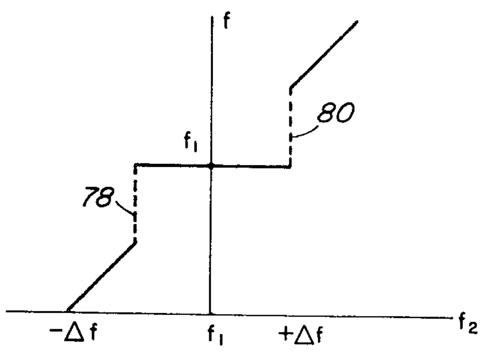
FIG. 7 is a graph illustrating actual versus natural operating frequency for a phase locked oscillator.

The equivalent circuit is similar to the one shown in FIG. 6 and the actual operating frequency plotted against the natural operating frequency for a phase locked oscillator is shown in FIG. 7. In this mode of operation the frequency of the locking signal $f_1$ is fixed and the oscillator is tuned to be locked at frequency $f_2$ by tuning through the locking frequency. The natural oscillator frequency $f_2$ is plotted as the abscissa and the actual operating oscillator frequency $f$ is plotted as the ordinate. When the oscillator frequency is separated by values equal to or less than $\pm\Delta f$ indicated by dotted lines 78 and 80, the oscillator frequency will be equal to the locking frequency $f_1$ and the oscillator is considered to be phase locked. If the separation is greater than $\pm\Delta f$ locking does not occur.

Figure 8:
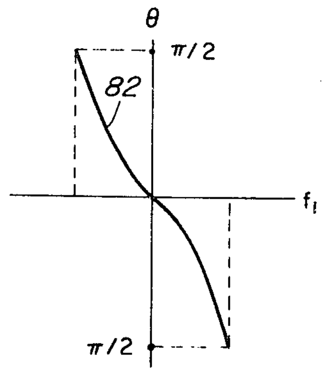
FIG. 8 is another graph illustrative of the phase angle of the phase locked oscillator.

The variation over the locking range $\pm\Delta f$ results in the phase of the oscillator RF voltage differing from the phase of the injected signal by an amount $\theta$ as shown in FIG. 8. The value of $\theta$ varies from $+\pi/2$ to $-\pi/2$ across the locking range as indicated by line 82. The bandwidth of the amplifier in the phase locking operation is substantially equal to the locking range and is given by the relation:

$$\text{Bandwidth} = 2\Delta f = f_2 a/Q_e \qquad (17)$$

Over the bandwidth the output frequency is substantially equal to the input frequency and the bandwidth is proportional to the square root of the drive power. The gain of a single stage device, therefore, is equal to $a^2$.

By employing cascaded stages of phase locked devices the bandwidth of all stages is substantially the same and the ratio of $a/Q_e$ is constant. All the oscillator elements in the succeeding stages operate at substantially the same RF voltage and yield the same power output. The number of oscillators, therefore, in each stage would be a value of $a^2$ greater than the previous stages. The characteristic admittance of the load transmission line is $a^2$ times that of the previous stage. The ultimate limit on the gain and power output of the phase locked device is the condition that requires the R/Q of each oscillator to be maintained substantially constant by keeping the RF circuit geometry of and between each oscillator essentially the same.

It is apparent that high-power electromagnetic energy may be generated by a solid-state amplifier system utilizing coupled parallel semiconductor elements mounted in the enumerated configurations with relatively high efficiencies and stable operation. Various amplifying elements including bulk oscillators, such as quenched Gunn devices, and IMPATT devices lend themselves to the practice of the invention with the total number of such devices to be operated in parallel in a single cavity to be determined in conjunction with the mechanical limitations in the mode of operation preferred. Since many modifications or alterations will be apparent to those skilled in the art, it is intended that the description of the preferred embodiments be considered as illustrative only and not in a limiting sense.

What is claimed is:

1. An amplifier system comprising:
   - a high-frequency electromagnetic energy source;
   - a multistage cascade array of amplifying means including a plurality of electrically paralleled solid-state elements exhibiting negative resistance characteristics disposed within a plurality of resonant cavities;
   - the total number of said elements successively increasing in each successive resonant cavity;
   - circuit means interconnecting said source and each stage of said array in cascade to utilization means;
   - said circuit means including four-port circulator energy transmission means each interconnecting through impedance transformer means each of said resonant cavities; and
   - means for absorbing undesired reflected energy coupled to one port of each circulator means.

2. An amplifier system according to claim 1 wherein said paralleled amplifying elements comprise solid-state oscillator devices.

3. An amplifier system according to claim 1 wherein said paralleled amplifying elements comprise bulk effect solid-state oscillator devices.

4. An amplifier system according to claim 1 wherein said paralleled amplifying elements comprise solid-state avalanche transit time oscillator devices.

5. An amplifier system according to claim 1 wherein said circulator means include a ferrimagnetic material.

* * * * *